(12) United States Patent
Kameyama et al.

(10) Patent No.: US 8,565,280 B2
(45) Date of Patent: Oct. 22, 2013

(54) SEMICONDUCTOR LASER ELEMENT, SEMICONDUCTOR LASER DEVICE, AND OPTICAL APPARATUS EMPLOYING THE SAME

(75) Inventors: Shingo Kameyama, Ibaraki (JP); Hiroyuki Yukawa, Kishiwada (JP)

(73) Assignee: Sanyo Electric Co., Ltd., Moriguchi-Shi, Osaka (JP)

( * ) Notice: Subject to any disclaimer, the term of this patent is extended or adjusted under 35 U.S.C. 154(b) by 131 days.

(21) Appl. No.: 13/232,272

(22) Filed: Sep. 14, 2011

(65) Prior Publication Data

US 2012/0063483 A1 Mar. 15, 2012

(30) Foreign Application Priority Data

Sep. 14, 2010 (JP) ................. 2010-205447
Sep. 24, 2010 (JP) ................. 2010-214047

(51) Int. Cl.
*H01S 5/00* (2006.01)

(52) U.S. Cl.
USPC ............. 372/49.01; 372/43.01; 372/50.1

(58) Field of Classification Search
USPC ................... 372/43.01, 49.01, 50.1
See application file for complete search history.

(56) References Cited

U.S. PATENT DOCUMENTS

| | | | |
|---|---|---|---|
| 4,563,368 A * | 1/1986 | Tihanyi et al. | 438/38 |
| 2006/0155605 A1* | 7/2006 | Haighton et al. | 705/26 |
| 2006/0159146 A1* | 7/2006 | Iwayama et al. | 372/49.01 |
| 2008/0303051 A1 | 12/2008 | Kawaguchi et al. | |
| 2008/0309218 A1 | 12/2008 | Kamikawa et al. | |
| 2011/0164643 A1* | 7/2011 | Tohyama et al. | 372/49.01 |

FOREIGN PATENT DOCUMENTS

| | | |
|---|---|---|
| JP | 2000-349389 A | 12/2000 |
| JP | 2006-186228 A | 7/2006 |
| JP | 2008-305848 A | 12/2008 |
| JP | 2009-21548 A | 1/2009 |

\* cited by examiner

*Primary Examiner* — Armando Rodriguez
(74) *Attorney, Agent, or Firm* — Ditthavong Mori & Steiner, P.C.

(57) ABSTRACT

This semiconductor laser element includes a semiconductor element layer including an active layer and having an emitting side cavity facet and a reflecting side cavity facet, and a facet coating film on a surface of the emitting side cavity facet. The facet coating film includes a photocatalytic layer arranged on an outermost surface of the facet coating film and a dielectric layer arranged between the photocatalytic layer and the emitting side cavity facet. A thickness of the dielectric layer is set to a thickness defined by m×λ/(2×n) (m is an integer), where a wavelength of a laser beam emitted from the active layer is λ and a refractive index of the dielectric layer is n, and at least 1 μm.

20 Claims, 6 Drawing Sheets

SEMICONDUCTOR LASER ELEMENT, SEMICONDUCTOR LASER DEVICE, AND OPTICAL APPARATUS EMPLOYING THE SAME

CROSS-REFERENCE TO RELATED APPLICATIONS

The priority application Nos. JP2010-205447, Semiconductor Laser Element, Semiconductor Laser Device, and Optical Apparatus Employing the Same, Sep. 14, 2010, Shingo Kameyama et al., and JP2010-214047, Semiconductor Laser Element, Semiconductor Laser Device, and Optical Apparatus Employing the Same, Sep. 24, 2010, Shingo Kameyama et al., upon which this patent application is based, are hereby incorporated by reference.

BACKGROUND OF THE INVENTION

1. Field of the Invention

The present invention relates to a semiconductor laser element, a semiconductor laser device, and an optical apparatus employing the same, and more particularly, it relates to a semiconductor laser element formed with a facet coating film on a cavity facet, a semiconductor laser device, and an optical apparatus employing the same.

2. Description of the Background Art

A semiconductor laser element formed with a facet coating film on a cavity facet is known in general, as disclosed in each of Japanese Patent Laying-Open Nos. 2000-349389 and 2006-186228, for example.

Each of Japanese Patent Laying-Open Nos. 2000-349389 and 2006-186228 discloses a semiconductor laser element formed with a facet coating film on a cavity facet on a laser beam-emitting side. In this facet coating film, an optical thin film layer of $Al_2O_3$ and a photocatalytic layer of $TiO_2$ are stacked successively from the side closer to the cavity facet. Due to the optical thin film layer, the laser reflectance of the cavity facet is set to a prescribed magnitude, and due to the photocatalytic layer, contaminants (organic substances) adhering to the outermost surface of the facet coating film are decomposed.

In the semiconductor laser element disclosed in each of Japanese Patent Laying-Open Nos. 2000-349389 and 2006-186228, the photocatalytic layer is provided on the outermost surface of the facet coating film, and hence the contaminants adhering to the outermost surface of the facet coating film are conceivably removed to some extent due to photocatalytic action. However, in a blue-violet semiconductor laser element having a short lasing wavelength of about 405 nm or the like, adherence of contaminants to an emitting facet tends to be significantly promoted due to an increase in light energy (light density). Therefore, in the semiconductor laser element including the facet coating film made of only the optical thin film layer controlling the reflectance and the photocatalytic layer, the amount of deposition of contaminants may exceed the amount of removal of contaminants, and adherence of contaminants to the outermost surface of an emitting facet cannot be reliably inhibited.

SUMMARY OF THE INVENTION

A semiconductor laser element according to a first aspect of the present invention includes a semiconductor element layer including an active layer and having an emitting side cavity facet and a reflecting side cavity facet, and a facet coating film on a surface of the emitting side cavity facet, wherein the facet coating film includes a photocatalytic layer arranged on an outermost surface of the facet coating film and a dielectric layer arranged between the photocatalytic layer and the emitting side cavity facet, and a thickness of the dielectric layer is set to a thickness defined by $m \times \lambda/(2 \times n)$ (m is an integer), where a wavelength of a laser beam emitted from the active layer is $\lambda$ and a refractive index of the dielectric layer is n, and at least 1 µm. In the present invention, the emitting side cavity facet and the reflecting side cavity facet are distinguished from each other through the large-small relation between the intensity levels of laser beams emitted from a pair of cavity facets. In other words, the emitting side cavity facet has relatively larger light intensity of the laser beam, and the reflecting side cavity facet has relatively smaller light intensity of the laser beam.

In the semiconductor laser element according to the first aspect of the present invention, as hereinabove described, the facet coating film includes the photocatalytic layer arranged on the outermost surface of the facet coating film and the dielectric layer arranged between the photocatalytic layer and the emitting side cavity facet, and the thickness of the dielectric layer is set to a thickness defined by $m \times \lambda/(2 \times n)$, and at least 1 µm. Thus, the laser beam emitted from the emitting side cavity facet is transmitted through the thick dielectric layer, and hence the light density of the laser beam on an outermost surface of the dielectric layer immediately after transmission can be effectively reduced. Thus, formation of contaminants on the outermost surface (a surface of the photocatalytic layer) of the emitting side cavity facet resulting from the reaction of water molecules in the atmosphere, low molecular siloxane or volatile organic gas present in minute amounts in the atmosphere, or the like with an emitted laser beam can be inhibited. Moreover, adherence of contaminants to the outermost surface can be further inhibited due to photocatalytic action of the photocatalytic layer provided on the outermost surface of the facet coating film, and hence formation of contaminants on the outermost surface of the emitting side cavity facet can be reliably inhibited. Consequently, the semiconductor laser element can stably operate. The thickness of the dielectric layer is more preferably at least 1.32 µm.

Further, in the semiconductor laser element according to the first aspect, as hereinabove described, contaminants hardly adhere to the outermost surface of the emitting side cavity facet, and hence a semiconductor laser device mounted with the semiconductor laser element can be formed with no closed type package hermetically sealing the semiconductor laser element.

In the aforementioned semiconductor laser element according to the first aspect, a thickness of the photocatalytic layer is preferably smaller than the thickness of the dielectric layer. According to this structure, the absorption of a laser beam, the light density of which is properly reduced by the dielectric layer, into the photocatalytic layer can be inhibited as much as possible. Thus, abnormal heat generation on the outermost surface (the surface of the photocatalytic layer) of the emitting side cavity facet can be inhibited, and hence formation of contaminants on the outermost surface of the emitting side cavity facet can be more reliably inhibited.

In the aforementioned structure in which the thickness of the photocatalytic layer is smaller than the thickness of the dielectric layer, the photocatalytic layer is preferably set to a thickness defined by $m \times \lambda/(2 \times n)$ (m is an integer). According to this structure, the absorption of the laser beam, the light density of which is properly reduced by the dielectric layer, into the photocatalytic layer can be inhibited as much as possible. Thus, abnormal heat generation on the outermost surface (the photocatalytic layer) of the facet coating film can be inhibited, and hence formation of contaminants on the outermost surface of the facet coating film can be more reliably inhibited.

In the aforementioned structure in which the thickness of the photocatalytic layer is smaller than the thickness of the dielectric layer, a refractive index of the photocatalytic layer is preferably larger than the refractive index of the dielectric layer. According to this structure, the thickness of the photocatalytic layer can be easily rendered smaller (thinner) than the thickness of the dielectric layer.

In the aforementioned semiconductor laser element according to the first aspect, the photocatalytic layer preferably includes a microcrystalline layer of $TiO_2$ and an amorphous layer of $TiO_2$. According to this structure, photocatalytic action of the photocatalytic layer can be reliably exerted.

In this case, the photocatalytic layer preferably further includes a layer having a crystalline substance of $TiO_2$, formed in a portion corresponding to the active layer. According to this structure, without losing the effect of inhibiting adherence of contaminants, which the photocatalytic layer has, a laser beam emitted from the emitting side cavity facet can be transmitted through the layer having a crystalline substance of $TiO_2$ and emitted outside without difficulty.

In the aforementioned semiconductor laser element according to the first aspect, the photocatalytic layer and the dielectric layer are preferably in contact with each other. According to this structure, a dielectric film or the like increasing the light density does not lie between the dielectric layer and the photocatalytic layer, and hence a laser beam, the light density of which is properly reduced by the dielectric layer can be transmitted through the photocatalytic layer and emitted. In other words, the absorption of the laser beam into the photocatalytic layer is inhibited as much as possible, and hence abnormal heat generation on the outermost surface (photocatalytic layer) of the facet coating film can be reliably inhibited.

In the aforementioned semiconductor laser element according to the first aspect, the photocatalytic layer is preferably formed on the dielectric layer through a first nitride film. According to this structure, the first nitride film is provided between the dielectric layer and the photocatalytic layer, whereby the photocatalytic layer can be improved in crystallinity. Thus, the photocatalytic effect of the photocatalytic layer can be enhanced.

In the aforementioned semiconductor laser element according to the first aspect, the dielectric layer is preferably made of a $SiO_2$ film. According to this structure, an oxide film of $SiO_2$ having a small film stress is employed even if the thickness of the dielectric layer is large, at least 1 μm, and hence the film stress of the thick dielectric layer can be reduced as much as possible. The thickness of the dielectric layer is preferably not more than 2.5 μm. According to this structure, separation of the dielectric layer from the emitting side cavity facet can be rendered hard to generate, and the control of the thickness can be maintained.

In the aforementioned semiconductor laser element according to the first aspect, the dielectric layer preferably has a multi-layer film structure made of a plurality of dielectric films, and a thickness of each of the plurality of dielectric films is preferably set to a thickness defined by $m×\lambda/(2×n)$ (m is an integer), where the wavelength of the laser beam emitted from the active layer is $\lambda$ and a refractive index of each of the plurality of dielectric films is n, while the thickness of the dielectric layer is preferably at least 1 μm. According to this structure, the laser beam emitted from the emitting side cavity facet is transmitted through the thick dielectric layer having the multi-layer film structure, and hence the light density of the laser beam in an outermost film of the dielectric layer immediately after transmission can be effectively reduced. Moreover, adherence of contaminants to the outermost surface can be further inhibited due to photocatalytic action of the photocatalytic layer provided on the outermost surface of the facet coating film. Thus, formation of contaminants on the outermost surface of the emitting side cavity facet can be reliably inhibited, and hence the semiconductor laser element can stably operate.

Further, the thickness of each of the plurality of dielectric films is a thickness defined by $m×\lambda/(2×n)$, and hence the plurality of dielectric films constituting the dielectric layer, each having a thickness not influencing the reflectance are stacked even if the dielectric layer has the multi-layer film structure. Thus, the reflectance of the emitting side cavity facet can be easily set without any influence of the dielectric layer. The thickness of the dielectric layer is more preferably at least 1.32 μm.

In the aforementioned structure in which the dielectric layer has the multi-layer film structure made of the plurality of dielectric films, the dielectric layer preferably has the multi-layer film structure obtained by stacking a first dielectric film of $SiO_2$ and a second dielectric film of AlON, and a thickness of the first dielectric film is preferably larger than a thickness of the second dielectric film. According to this structure, the thickness of the second dielectric film of an oxynitride film (AlON) with a relatively larger film stress is rendered smaller than the thickness of the first dielectric film of an oxide film ($SiO_2$) with a relatively smaller film stress to form the dielectric layer, and hence an excessive increase in the film stress of the thick dielectric layer (first dielectric film) can be inhibited.

In this case, at least two first dielectric films and at least two second dielectric films are preferably alternately stacked in the dielectric layer. According to this structure, the dielectric layer can be formed by repeatedly alternately arranging an oxynitride film with a relatively larger film stress and an oxide film with a relatively smaller film stress, and hence the thick dielectric layer can be easily formed while an excessive increase in the film stress is inhibited.

In the aforementioned semiconductor laser element according to the first aspect, the facet coating film preferably further includes a reflectance control layer controlling a reflectance of the emitting side cavity facet. According to this structure, the reflectance control layer different from the dielectric layer reducing the light density of a laser beam is provided on the emitting side cavity facet, and hence the reflectance of the emitting side cavity facet can be easily controlled by the reflectance control layer without any influence of the thick dielectric layer. In the present invention, the reflectance control layer is a single-layer dielectric film having a thickness other than a thickness defined by $m×\lambda/(2×n)$ (m is an integer) or a dielectric layer in which a plurality of dielectric films each having a thickness other than a thickness defined by $m×\lambda/(2×n)$ (m is an integer) are stacked, and the reflectance control layer denotes a wide concept indicating a layer substantially reflecting a laser beam. If the reflectance control layer is made of a plurality of dielectric films, at least one film of the dielectric films has a thickness of $\lambda/(4×n)$ or approximately $\lambda/(4×n)$.

In this case, a high refractive index layer having a refractive index larger than the refractive index of the dielectric layer and a low refractive index layer having a refractive index smaller than the refractive index of the high refractive index layer are preferably stacked in the reflectance control layer, and the dielectric layer and the reflectance control layer are preferably arranged through the high refractive index layer of the reflectance control layer. According to this structure, a refractive index difference can be provided between the reflectance control layer and the dielectric layer, and hence a laser beam, the reflectance for which is properly adjusted by the reflectance control layer, can be incident upon the dielectric layer without difficulty. Further, a laser beam, the light density of which is properly reduced by the dielectric layer, can be incident upon the reflectance control layer without difficulty.

In the aforementioned semiconductor laser element according to the first aspect, the facet coating film preferably further includes an oxidation preventing layer preventing oxidation of the emitting side cavity facet. According to this structure, oxygen contained in the external atmosphere can be inhibited from being transmitted through the photocatalytic layer and the dielectric layer and diffused into the semiconductor element layer. Further, oxygen contained in the facet coating film can be inhibited from being diffused into the semiconductor element layer even if the facet coating film contains oxygen. Thus, a non-radiative recombination level causing absorption of a laser beam and heat generation is hardly generated on the emitting side cavity facet, and hence catastrophic optical damage (COD) in the facet coating film can be inhibited.

In the aforementioned structure in which the facet coating film further includes the oxidation preventing layer, the oxidation preventing layer is preferably a dielectric film made of a plurality of layers. According to this structure, the film stress of the oxidation preventing layer can be properly adjusted by stacking the plurality of layers. Thus, adhesiveness between the oxidation preventing layer constituting the facet coating film, the dielectric layer, and the photocatalytic layer and adhesiveness between the facet coating film and the semiconductor element layer can be improved.

In the aforementioned structure in which the facet coating film further includes the oxidation preventing layer, the oxidation preventing layer preferably has a second nitride film coming into contact with the emitting side cavity facet. According to this structure, the oxidation preventing layer (second nitride film) coming into contact with the emitting side cavity facet does not contain oxygen, and hence oxygen contained in the external atmosphere and the facet coating film can be reliably prevented from being diffused into the semiconductor element layer.

In the aforementioned semiconductor laser element according to the first aspect, the semiconductor element layer is preferably made of a nitride-based semiconductor. When the semiconductor laser element is made of a nitride-based semiconductor, a laser beam with a shorter wavelength (400 nm band) is emitted from the semiconductor laser element, as compared with a red or infrared semiconductor laser element made of a GaAs-based semiconductor or the like. Further, the nitride-based semiconductor laser element requires a higher output power in response to a double speed optical disk system or an increased storage capacity. In the semiconductor laser element emitting a laser beam with a shorter wavelength and requiring a higher output power, adherence of contaminants to the outermost surface of an emitting facet tends to be significantly promoted due to an increase in the light density on the emitting side cavity facet. Therefore, the nitride-based semiconductor laser element includes the "facet coating film" in the present invention, whereby adherence of contaminants to the outermost surface of an emitting facet can be effectively reliably inhibited.

A semiconductor laser device according to a second aspect of the present invention includes a semiconductor laser element including a semiconductor element layer including an active layer and having an emitting side cavity facet and a reflecting side cavity facet, and a facet coating film on a surface of the emitting side cavity facet, and an open-to-atmosphere-type package mounting with the semiconductor laser element, wherein the facet coating film includes a photocatalytic layer arranged on an outermost surface of the facet coating film and a dielectric layer arranged between the photocatalytic layer and the emitting side cavity facet, and a thickness of the dielectric layer is set to a thickness defined by $m \times \lambda/(2 \times n)$ (m is an integer), where a wavelength of a laser beam emitted from the active layer is $\lambda$ and a refractive index of the dielectric layer is n, and at least 1 µm.

The semiconductor laser device according to the second aspect of the present invention includes the semiconductor laser element having the aforementioned structure, and hence formation of contaminants on the outermost surface of the emitting side cavity facet of the semiconductor laser element can be reliably inhibited. Consequently, the reliable semiconductor laser device capable of stably operating the semiconductor laser element and enduring the use for a long time can be obtained.

Further, the semiconductor laser device according to the second aspect includes the open-to-atmosphere-type package as hereinabove described, and hence the structure of the semiconductor laser device can be simplified.

An optical apparatus according to a third aspect of the present invention includes a semiconductor laser device including a semiconductor laser element having a semiconductor element layer including an active layer and having an emitting side cavity facet and a reflecting side cavity facet, and a facet coating film on a surface of the emitting side cavity facet, and an open-to-atmosphere-type package mounting with the semiconductor laser element, and an optical system controlling a beam emitted from the semiconductor laser element, wherein the facet coating film includes a photocatalytic layer arranged on an outermost surface of the facet coating film and a dielectric layer arranged between the photocatalytic layer and the emitting side cavity facet, and a thickness of the dielectric layer is set to a thickness defined by $m \times \lambda/(2 \times n)$ (m is an integer), where a wavelength of a laser beam emitted from the active layer is $\lambda$ and a refractive index of the dielectric layer is n, and at least 1 µm.

The optical apparatus according to the third aspect of the present invention includes the semiconductor laser device including the semiconductor laser element having the aforementioned structure, and hence formation of contaminants on the outermost surface of the emitting side cavity facet of the semiconductor laser element can be reliably inhibited. Consequently, the optical apparatus mounted with the reliable semiconductor laser device capable of enduring the use for a long time can be easily obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

First Embodiment

The structure of a blue-violet semiconductor laser element 100 according to a first embodiment of the present invention is now described with reference to FIGS. 1 and 2. The blue-violet semiconductor laser element 100 is an example of the "semiconductor laser element" in the present invention.

Figure 1:
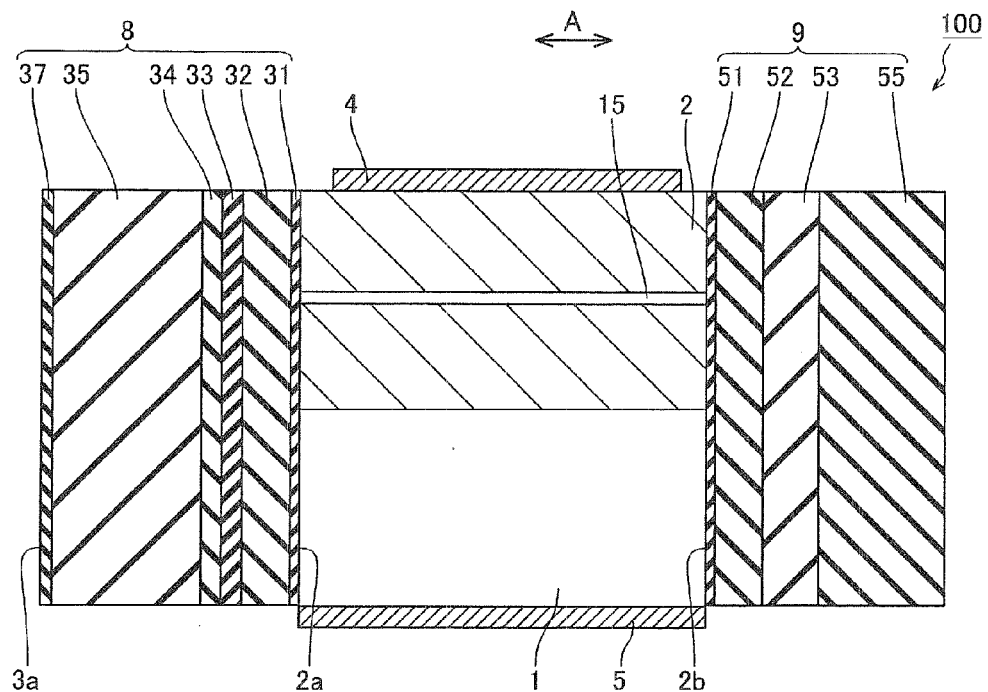
FIG. 1 is a longitudinal sectional view of a blue-violet semiconductor laser element according to a first embodiment of the present invention in a state cut parallelly to a cavity direction.

The blue-violet semiconductor laser element 100 has a lasing wavelength of about 405 nm and is formed with a semiconductor element layer 2 made of a plurality of nitride-based semiconductor layers including an active layer 15 on a surface of an n-type GaN substrate 1, as shown in FIG. 1. A p-side electrode 4 is formed on the upper surface of the semiconductor element layer 2, and an n-side electrode 5 is formed on the lower surface of the n-type GaN substrate 1. The semiconductor element layer 2 is formed with cavity facets 2a and 2b orthogonal to the extensional direction (direction A) of a cavity, and facet coating films 8 and 9 are formed on the cavity facets 2a and 2b, respectively. The cavity facets 2a and 2b are examples of the "emitting side cavity facet" and the "reflecting side cavity facet" in the present invention, respectively.

The facet coating film 8 has a multi-layer film structure obtained by stacking a plurality of inorganic dielectric layers on the cavity facet 2a in prescribed order. Specifically, the facet coating film 8 is constituted by an AlN film 31 having a thickness of about 10 nm coming into contact with the cavity facet 2a, an $Al_2O_3$ film 32 having a thickness of about 120 nm coming into contact with the AlN film 31, a $SiO_2$ film 33 having a thickness of about 68 nm coming into contact with the $Al_2O_3$ film 32, an $Al_2O_3$ film 34 having a thickness of about 60 nm coming into contact with the $SiO_2$ film 33, a single-layer $SiO_2$ film 35 having a thickness of about 2052 nm coming into contact with the $Al_2O_3$ film 34, and a thin $TiO_2$ film 37 having a thickness of about 78 nm coming into contact with the $SiO_2$ film 35. The surface of the $TiO_2$ film 37 is an outermost surface 3a of an emitting facet. Two layers of the AlN film 31 and the $Al_2O_3$ film 32 have a function of preventing oxidation of the cavity facet 2a. Two layers of the $SiO_2$ film 33 and the $Al_2O_3$ film 34 have a function of controlling the laser reflectance of the cavity facet 2a. The AlN film 31 and the $Al_2O_3$ film 32 are an example of the "oxidation preventing layer" in the present invention. The AlN film 31 is an example of the "second nitride film" in the present invention. The $SiO_2$ film 33 and the $Al_2O_3$ film 34 are an example of the "reflectance control layer" in the present invention, and the $SiO_2$ film 35 is an example of the "dielectric layer" in the present invention. The $TiO_2$ film 37 is an example of the "photocatalytic layer" in the present invention.

According to the first embodiment, the thickness (about 68 nm) of the $SiO_2$ film 33 is set by applying a relational expression shown by $m \times \lambda/(4 \times n)$ (m=1) when the refractive index of $SiO_2$ is n (=about 1.48). The thickness (about 60 nm) of the $Al_2O_3$ film 34 is set by applying the relational expression shown by $m \times \lambda/(4 \times n)$ (m=1) when the refractive index of $Al_2O_3$ is n (=about 1.68). Thus, each of the $SiO_2$ film 33 and the $Al_2O_3$ film 34 is set to a thickness other than $m \times \lambda/(2 \times n)$. Thus, the laser reflectance of the cavity facet 2a is set to about 25%. The $SiO_2$ film 33 and the $Al_2O_3$ film 34 are examples of the "low refractive index layer" and the "high refractive index layer" in the present invention, respectively.

According to the first embodiment, the thickness (about 2052 nm) of the $SiO_2$ film 35 is set by applying a relational expression shown by $m \times \lambda/(2 \times n)$ (m=15) when the refractive index of $SiO_2$ is n (=about 1.48). Thus, a laser beam is transmitted to the outermost surface 3a without being reflected in the $SiO_2$ film 35. The thickness of the $SiO_2$ film 35 is much larger than the total thickness of the $SiO_2$ film 33 and the $Al_2O_3$ film 34 controlling the reflectance, and hence the light density of the laser beam transmitted through the $SiO_2$ film 35 is gradually reduced as the laser beam approaches the outermost surface 3a.

According to the first embodiment, rutile type titanium dioxide serving as a photocatalyst material is employed as the $TiO_2$ film 37. In the $TiO_2$ film 37, rutile type titanium dioxide and anatase-type titanium dioxide may be mixed. The $TiO_2$ film 37 includes a microcrystalline layer of $TiO_2$ and an amorphous layer of $TiO_2$. A portion of the $TiO_2$ film 37 corresponding to the active layer 15 may have a crystalline substance. Thus, without losing the effect of inhibiting adherence of contaminants, which the $TiO_2$ film 37 has, a laser beam emitted from the cavity facet 2a can be transmitted through a layer having a crystalline substance of $TiO_2$ and emitted outside without difficulty. The thickness (about 78 nm) of the $TiO_2$ film 37 is set by applying a relational expression shown by $m \times \lambda/(2 \times n)$ (m=1) when the refractive index of $TiO_2$ is n (=about 2.6).

The facet coating film 9 also has a multi-layer film structure obtained by stacking a plurality of inorganic dielectric layers on the cavity facet 2b in prescribed order. Specifically, the facet coating film 9 is constituted by an AlN film 51 having a thickness of about 10 nm coming into contact with the cavity facet 2b, an $Al_2O_3$ film 52 having a thickness of about 120 nm, a SiO$_2$ film 53 having a thickness of about 140 nm, and a multilayer reflecting film 55 having a thickness of about 340 nm. The multilayer reflecting film 55 has a structure obtained by alternately stacking three SiO$_2$ films each having a thickness of about 68 nm as a low refractive index film and three ZrO$_2$ films each having a thickness of about 45 nm as a high refractive index film, and the laser reflectance of the cavity facet 2b is set to about 80% due to the multilayer reflecting film 55.

Figure 2:
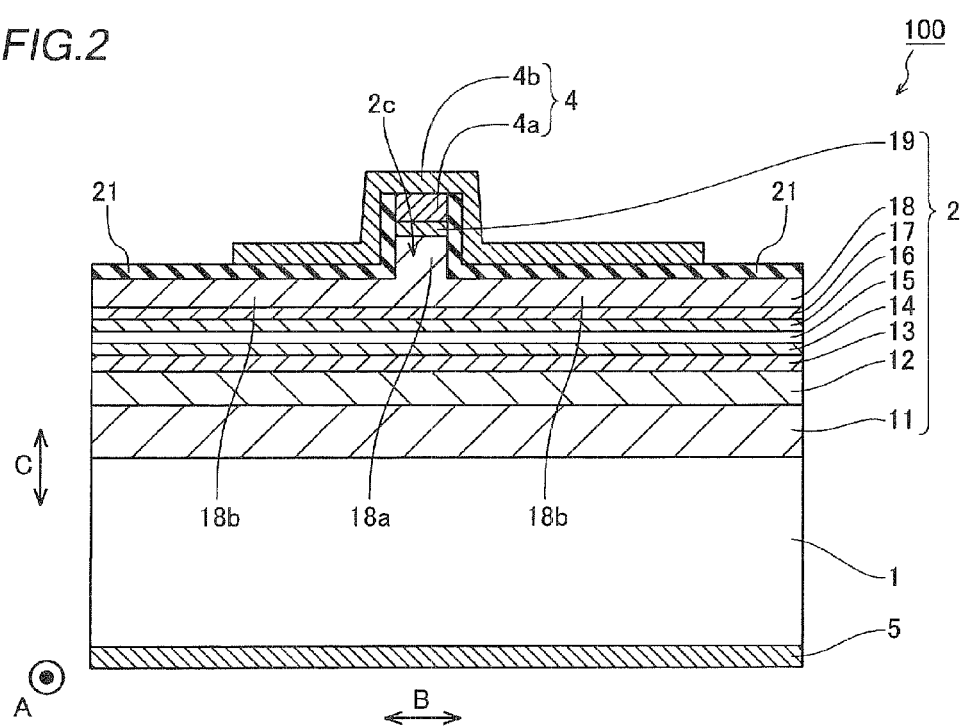
FIG. 2 is a longitudinal sectional view of the blue-violet semiconductor laser element according to the first embodiment of the present invention in a state cut perpendicularly to the cavity direction.

In the semiconductor element layer 2, an n-type layer 11 is formed on the n-type GaN substrate 1, as shown in FIG. 2. An n-type cladding layer 12 is formed on the n-type layer 11. An n-type carrier blocking layer 13 is formed on the n-type cladding layer 12. An n-side optical guiding layer 14 is formed on the n-type carrier blocking layer 13. The active layer 15 having a multiple quantum well (MQW) structure obtained by alternately stacking four barrier layers (not shown) of GaN and three quantum well layers (not shown) of InGaN having a higher In composition is formed on the n-side optical guiding layer 14.

A p-side optical guiding layer 16 is formed on the active layer 15. A p-type cap layer 17 is formed on the p-side optical guiding layer 16. A p-type cladding layer 18 is formed on the p-type cap layer 17. The p-type cladding layer 18 is constituted by a projecting portion 18a, having a width of about 1.5 μm, extending in the [1-100] direction (direction A) in a striped manner and planar portions 18b extending on both sides of the projecting portion 18a.

A p-side contact layer 19 is formed on the projecting portion 18a of the p-type cladding layer 18. This p-side contact layer 19 and the projecting portion 18a of the p-type cladding layer 18 form a ridge portion 2c extending in the direction A in a striped manner. The ridge portion 2c constitutes a current injection portion, while a waveguide extending in the [1-100] direction (direction A) in a striped manner along the ridge portion 2c is formed in a region, including the active layer 15, located under the ridge portion 2c. The n-type layer 11, the n-type cladding layer 12, the n-type carrier blocking layer 13, the n-side optical guiding layer 14, the active layer 15, the p-side optical guiding layer 16, the p-type cap layer 17, the p-type cladding layer 18, and the p-side contact layer 19 are examples of the "semiconductor element layer" in the present invention.

A current blocking layer 21 of SiO$_2$ having a thickness of about 0.3 μm is formed on the side surfaces of the projecting portion 18a of the p-type cladding layer 18 and the upper surfaces of the planar portions 18b thereof. The upper surface of the ridge portion 2c (upper surface of the p-side contact layer 19) other than regions near the cavity facets 2a and 2b is exposed from the current blocking layer 21.

The p-side electrode 4 is constituted by an ohmic electrode 4a formed to be in contact with the upper surface of the ridge portion 2c and a p-side pad electrode 4b formed on the ohmic electrode 4a and the current blocking layer 21. In the ohmic electrode 4a, a Pt layer having a thickness of about 5 nm, a Pd layer having a thickness of about 100 nm, and an Au layer having a thickness of about 150 nm are stacked in this order from the side closer to the p-side contact layer 19. In the p-side pad electrode 4b, a Ti layer having a thickness of about 0.1 μm, a Pd layer having a thickness of about 0.1 μm, and an Au layer having a thickness of about 3 μm are stacked in this order from the side closer to the ohmic electrode 4a and the current blocking layer 21.

In the n-side electrode 5, an Al layer having a thickness of about 10 nm, a Pt layer having a thickness of about 20 nm, and an Au layer having a thickness of about 300 nm are stacked in this order from the side closer to the n-type GaN substrate 1.

A manufacturing process for the blue-violet semiconductor laser element 100 is now described with reference to FIGS. 1 and 2.

First, the n-type layer 11, the n-type cladding layer 12, the n-type carrier blocking layer 13, the n-side optical guiding layer 14, and the active layer 15 are successively formed on the n-type GaN substrate 1 by metal organic vapor phase epitaxy (MOVPE), as shown in FIG. 2. Further, the p-side optical guiding layer 16, the p-type cap layer 17, the p-type cladding layer 18, and the p-side contact layer 19 are successively formed on the active layer 15. Thereafter, p-type annealing treatment and formation of the ridge portion 2c by etching are performed.

Thereafter, the ohmic electrode 4a is formed on the ridge portion 2c, while the current blocking layer 21 is formed by vacuum evaporation. The upper surface of the ohmic electrode 4a is exposed by removing the current blocking layer 21 on the ohmic electrode 4a, and thereafter the p-side pad electrode 4b is formed on the current blocking layer 21 to be in contact with the upper surface of the ohmic electrode 4a. Further, the n-side electrode 5 is formed on the lower surface of the n-type GaN substrate 1 by vacuum evaporation. Thus, a wafer of the blue-violet semiconductor laser element 100 is prepared.

Next, scribed lines are formed on the upper surface of the wafer of the blue-violet semiconductor laser element 100 in a direction orthogonal to the extensional direction of the ridge portion 2c. These scribed lines are formed on a portion excluding the ridge portion 2c in the form of broken lines.

Then, the wafer of the blue-violet semiconductor laser element 100 is cleaved along the scribed lines, to form a wafer in a bar state. Thereafter, the wafer in a bar state is introduced into an electron cyclotron resonance (ECR) sputtering film deposition apparatus.

ECR plasma is applied to the cavity facet 2a (see FIG. 1) formed by the aforementioned cleavage for 5 minutes, thereby cleaning the cavity facet 2a. The ECR plasma is generated under a condition of a microwave output of 500 W in a N$_2$ gas atmosphere of about 0.02 Pa. At this time, the cavity facet 2a is slightly etched. In this case, no RF power is applied to a sputtering target.

Then, the AlN film 31 is formed on the cavity facet 2a under conditions of an Ar gas flow rate of about 20 sccm, a N$_2$ gas flow rate of about 4.5 sccm, a microwave output of 500 W, and RF power of 500 W by ECR sputtering, employing Al as a metal target. Thereafter, the Al$_2$O$_3$ film 32 is formed on the AlN film 31 under conditions of an Ar gas flow rate of about 20 sccm, an O$_2$ gas flow rate of about 5 sccm, a microwave output of 500 W, and RF power of 500 W, employing Al as a metal target. Thereafter, the SiO$_2$ film 33 is formed on the Al$_2$O$_3$ film 32 under conditions of an Ar gas flow rate of about 20 sccm, an O$_2$ gas flow rate of about 7 sccm, a microwave output of 500 W, and RF power of 500 W, employing Si as a metal target. Thereafter, the Al$_2$O$_3$ film 34 is formed on the SiO$_2$ film 33 under conditions of an Ar gas flow rate of about 20 sccm, an O$_2$ gas flow rate of about 5 sccm, a microwave output of 500 W, and RF power of 500 W, employing Al as a metal target.

Thereafter, the SiO$_2$ film 35 is formed on the Al$_2$O$_3$ film 34 under conditions of an Ar gas flow rate of about 20 sccm, an O$_2$ gas flow rate of about 7 sccm, a microwave output of 500 W, and RF power of 500 W, employing Si as a metal target. Thereafter, the TiO$_2$ film 37 is formed on the SiO$_2$ film 35 under conditions of an Ar gas flow rate of about 6 to about 8 sccm, a O$_2$ gas flow rate of about 2.4 to about 3 sccm, a microwave output of 600 W, RF power of 600 W, and a pressure in a film forming chamber of about 0.025 to about 0.035 Pa by ECR sputtering, employing Ti as a metal target. Thus, the facet coating film 8 is formed on the cavity facet 2a.

Thereafter, similarly to the aforementioned cavity facet 2a, ECR plasma is applied to the other cavity facet 2b (see FIG. 1) formed by the aforementioned cleavage, thereby cleaning the cavity facet 2b.

Thereafter, the AlN film 51 is formed on the cavity facet 2b under conditions of an Ar gas flow rate of about 20 sccm, a $N_2$ gas flow rate of about 4.5 sccm, a microwave output of 500 W, and RF power of 500 W, employing Al as a metal target. Thereafter, the $Al_2O_3$ film 52 is formed on the AlN film 51 under conditions of an Ar gas flow rate of about 20 sccm, an $O_2$ gas flow rate of about 4 sccm, a microwave output of 500 W, and RF power of 500 W, employing Al as a metal target. Thereafter, the $SiO_2$ film 53 is formed on the $Al_2O_3$ film 52 under conditions of an Ar gas flow rate of about 20 sccm, an $O_2$ gas flow rate of about 7 sccm, a microwave output of 500 W, and RF power of 500 W, employing Si as a metal target. Thereafter, the $SiO_2$ film is formed on the $SiO_2$ film 53 under conditions of an Ar gas flow rate of about 20 sccm, an $O_2$ gas flow rate of about 7 sccm, a microwave output of 500 W, and RF power of 500 W, employing Si as a metal target. Thereafter, the $ZrO_2$ film is formed on the $SiO_2$ film under conditions of an Ar gas flow rate of about 15 sccm, an $O_2$ gas flow rate of about 1.5 sccm, a microwave output of 500 W, and RF power of 500 W, employing Zr as a metal target. The three $SiO_2$ films and the three $ZrO_2$ films are alternately stacked, thereby forming the multilayer reflecting film 55. Thus, the facet coating film 9 is formed on the cavity facet 2b.

Finally, the wafer in a bar state is separated into chips along the ridge portion 2c, whereby the blue-violet semiconductor laser element 100 is formed.

According to the first embodiment, as hereinabove described, the facet coating film 8 includes the $TiO_2$ film 37 arranged on the outermost surface 3a of the facet coating film 8 and the $SiO_2$ film 35 arranged between the $TiO_2$ film 37 and the cavity facet 2a. The thickness of the $SiO_2$ film 35 is a thickness defined by $m \times \lambda/(2 \times n)$ and at least 1 μm. Thus, the laser beam emitted from the cavity facet 2a is transmitted through the thick $SiO_2$ film 35, and hence the light density of the laser beam on the outermost surface of the $SiO_2$ film 35 immediately after transmission can be effectively reduced. Thus, formation of contaminants on the outermost surface 3a of the cavity facet 2a resulting from the reaction of water molecules in the atmosphere, low molecular siloxane or volatile organic gas present in minute amounts in the atmosphere, or the like with the emitted laser beam can be inhibited. Moreover, adherence of contaminants to the outermost surface 3a can be further inhibited due to photocatalytic action of the $TiO_2$ film 37 provided on the outermost surface 3a, and hence formation of contaminants on the outermost surface 3a can be reliably inhibited. Consequently, the blue-violet semiconductor laser element 100 can stably operate.

According to the first embodiment, the $SiO_2$ film 35 is formed of a single layer film. Thus, an oxide film of $SiO_2$ having a small film stress is employed even if the thickness of the $SiO_2$ film 35 is large, at least 1 μm, and hence the film stress of the thick $SiO_2$ film 35 can be reduced as much as possible. Further, the $SiO_2$ film 35 has a single layer structure, and hence the $SiO_2$ film 35 can be easily formed in the manufacturing process.

According to the first embodiment, contaminants hardly adhere to the outermost surface 3a of an emitting facet, and hence the semiconductor laser device mounted with the blue-violet semiconductor laser element 100 can be formed with no closed type package hermetically sealing the blue-violet semiconductor laser element 100.

According to the first embodiment, the thickness of the $TiO_2$ film 37 is smaller than the thickness of the $SiO_2$ film 35. Further, the thickness of the $TiO_2$ film 37 is set to have the relation of $m \times \lambda/(2 \times n)$, and m is equal to 1 in the aforementioned expression. Thus, the absorption of a laser beam, the light density of which is properly reduced by the $SiO_2$ film 35, into the $TiO_2$ film 37 can be inhibited as much as possible. Thus, abnormal heat generation on the outermost surface 3a can be inhibited, and hence formation of contaminants on the outermost surface 3a can be more reliably inhibited. In contrast, laser characteristics tend to deteriorate due to an increase in the aforementioned absorption if the $TiO_2$ film 37 is thickened ($m \geq 2$). In this respect, it is not preferred to thicken the $TiO_2$ film 37 while it is preferred to form the $TiO_2$ film 37 more thinly than the $SiO_2$ film 35.

According to the first embodiment, the refractive index (about 2.6) of the $TiO_2$ film 37 is larger than the refractive index (about 1.48) of the $SiO_2$ film 35, and hence the thickness of the $TiO_2$ film 37 can be easily rendered smaller (thinner) than the thickness of the $SiO_2$ film 35.

According to the first embodiment, the $TiO_2$ film 37 includes the microcrystalline layer of $TiO_2$ and the amorphous layer of $TiO_2$, and hence photocatalytic action of the $TiO_2$ film 37 can be reliably exerted.

According to the first embodiment, the $TiO_2$ film 37 and the $SiO_2$ film 35 are in contact with each other. Thus, a dielectric film or the like increasing the light density does not lie between the $SiO_2$ film 35 and the $TiO_2$ film 37, and hence a laser beam, the light density of which is properly reduced by the $SiO_2$ film 35 can be transmitted through the $TiO_2$ film 37 and emitted. In other words, the absorption of the laser beam into the $TiO_2$ film 37 is inhibited as much as possible, and hence abnormal heat generation on the outermost surface ($TiO_2$ film 37) of the facet coating film can be reliably inhibited.

According to the first embodiment, the AlN film 39 serving as an underlayer is provided between the $SiO_2$ film 35 and the $TiO_2$ film 37, whereby the $TiO_2$ film 37 can be improved in crystallinity by the AlN film 39. Thus, the photocatalytic effect of the $TiO_2$ film 37 can be enhanced.

According to the first embodiment, the facet coating film 8 includes the $SiO_2$ film 33 and the $Al_2O_3$ film 34 controlling the reflectance of the cavity facet 2a. Thus, the "reflectance control layer" in the present invention different from the $SiO_2$ film 35 effectively reducing the light density of a laser beam is provided on the cavity facet 2a, and hence the reflectance of the cavity facet 2a can be easily controlled by the "reflectance control layer" without any influence of the thick $SiO_2$ film 35.

According to the first embodiment, the "reflectance control layer" in the present invention is formed by stacking the $Al_2O_3$ film 34 having a refractive index (about 1.68) larger than the refractive index (about 1.48) of the $SiO_2$ film 35 and the $SiO_2$ film 33 having a refractive index (about 1.48) smaller than the refractive index of the $Al_2O_3$ film 34. The $SiO_2$ film 35 is in contact with the $Al_2O_3$ film 34. Thus, a refractive index difference can be provided between the $Al_2O_3$ film 34 and the $SiO_2$ film 35, and hence a laser beam, the reflectance for which is properly adjusted by the "reflectance control layer" in the present invention, can be incident upon the "dielectric layer" in the present invention without difficulty.

According to the first embodiment, the two layers of the AlN film 31 and the $Al_2O_3$ film 32 serving as the "oxidation preventing layer" preventing oxidation of the cavity facet 2a are provided in the facet coating film 8. Thus, oxygen contained in the external atmosphere can be inhibited from being transmitted through the $TiO_2$ film 37 and the $SiO_2$ film 35 and diffused into the semiconductor element layer 2. Further, the facet coating film 8 also contains oxygen, and hence oxygen contained in the facet coating film 8 can be inhibited from being diffused into the semiconductor element layer 2. Thus, a non-radiative recombination level causing absorption of a laser beam and heat generation is hardly generated on the cavity facet 2a, and hence catastrophic optical damage (COD) in the facet coating film 8 can be inhibited.

According to the first embodiment, the oxidation preventing layer is formed of the two layers of the AlN film 31 and the $Al_2O_3$ film 32, and hence the film stress of the oxidation preventing layer can be properly adjusted by the AlN film 31 and the $Al_2O_3$ film 32. Thus, adhesiveness between the oxidation preventing layer (the AlN film 31 and the $Al_2O_3$ film 32) constituting the facet coating film 8, the $SiO_2$ film 35, and the $TiO_2$ film 37 and adhesiveness between the facet coating film 8 and the semiconductor element layer 2 can be improved.

According to the first embodiment, the AlN film 31 is in contact with the cavity facet 2a. Thus, the AlN film 31 does not contain oxygen, and hence oxygen contained in the external atmosphere and the facet coating film 8 can be reliably prevented from being diffused into the semiconductor element layer 2.

According to the first embodiment, the facet coating film 8 is formed by providing the $SiO_2$ film 33, the $Al_2O_3$ film 34, and the $SiO_2$ film 35 in this order from the side closer to the cavity facet 2a. Thus, the $SiO_2$ film 33 and the $Al_2O_3$ film 34 determining the reflectance can be brought close to the cavity facet 2a of the semiconductor element layer 2 hardly influenced by surface roughness, and hence the $SiO_2$ film 33 and the $Al_2O_3$ film 34, the thicknesses of which are more accurately controlled in a film forming process, can be formed. Thus, a desired reflectance can be accurately obtained.

According to the first embodiment, a nitride-based semiconductor is employed as the semiconductor element layer 2. In the blue-violet semiconductor laser element 100 emitting a laser beam with a shorter wavelength (400 nm band) and requiring a higher output power, adherence of contaminants to the outermost surface 3a of an emitting facet tends to be significantly promoted due to an increase in the light density on the cavity facet 2a. Therefore, the blue-violet semiconductor laser element 100 includes the facet coating film 8 having the $SiO_2$ film 35 and the $TiO_2$ film 37, whereby adherence of contaminants to the outermost surface 3a of an emitting facet can be effectively reliably inhibited.

A confirmatory experiment conducted to confirm usefulness of providing the $SiO_2$ film 35 and the $TiO_2$ film 37 in the aforementioned facet coating film 8 is now described with reference to FIG. 3.

As a comparative example, a blue-violet semiconductor laser element having a structure similar to that of the blue-violet semiconductor laser element 100 except that the thick $SiO_2$ film 35 is not formed on the outermost surface of an emitting facet was prepared. Then, the blue-violet semiconductor laser element 100 and the blue-violet semiconductor laser element according to the comparative example were mounted on respective open package type (open-to-atmosphere-type) semiconductor laser devices in which the blue-violet semiconductor laser element 100 and the blue-violet semiconductor laser element according to the comparative example are not hermetically sealed. Then, a life test was performed by adjusting the semiconductor laser elements to 20 mW output power by Automatic Power Control (APC) under a condition of 75° C. and continuously driving the same.

Figure 3:
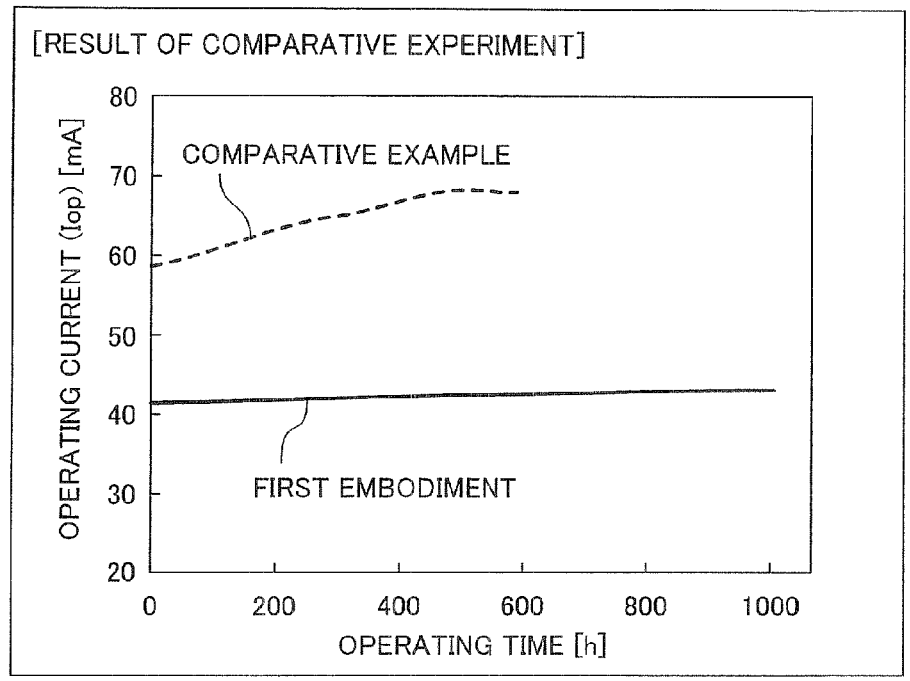
FIG. 3 is a diagram showing results of a confirmatory experiment conducted to confirm the effects of the first embodiment of the present invention.

As a result, in the blue-violet semiconductor laser element 100, relatively stable current transition was shown with no pronounced rise or fluctuation of an operating current even after 1000 hours whereas in the blue-violet semiconductor laser element according to the comparative example, an operating current started to rise immediately after operation and a similar pattern continued, as shown in FIG. 3. In other words, it has been confirmed that in the blue-violet semiconductor laser element 100, the light density of a laser beam emitted from the cavity facet 2a and transmitted through the $SiO_2$ film 35 is effectively reduced in the vicinity of the outermost facet 3a of an emitting facet, and adherence of contaminants to the outermost surface 3a and deposition of contaminants on the outermost surface 3a are inhibited due to photocatalytic action of the $TiO_2$ film 37 provided on the outermost surface 3a. It has been proved that the deposition thickness of contaminants was about 5 nm after a 1000-hour life test and this deposition thickness did not influence the characteristics of the element. From the aforementioned results, the usefulness of the "facet coating film" in the present invention has been confirmed.

An experiment for study conducted to investigate the allowable range of the thickness of the $SiO_2$ film 35 is now described with reference to FIG. 4.

Specifically, a blue-violet semiconductor laser element formed with a facet coating film 8 in which the thickness of a $SiO_2$ film 35 is controlled to be 1095 nm (m=8) and a blue-violet semiconductor laser element formed with a facet coating film 8 in which the thickness of a $SiO_2$ film 35 is controlled to be 2463 nm (m=18) in addition to the blue-violet semiconductor laser element 100 were prepared. Then, the aforementioned blue-violet semiconductor laser elements were mounted on respective open package type (open-to-atmosphere-type) semiconductor laser devices in which the blue-violet semiconductor laser elements are not hermetically sealed, and a life test was performed. Then, MTTF (mean time to failure) of each of the blue-violet semiconductor laser elements was calculated on the basis of the results of the life test. The MTTF was calculated by determining that a fault current value is 1.3 times larger than the initial current value of the laser element.

Figure 4:
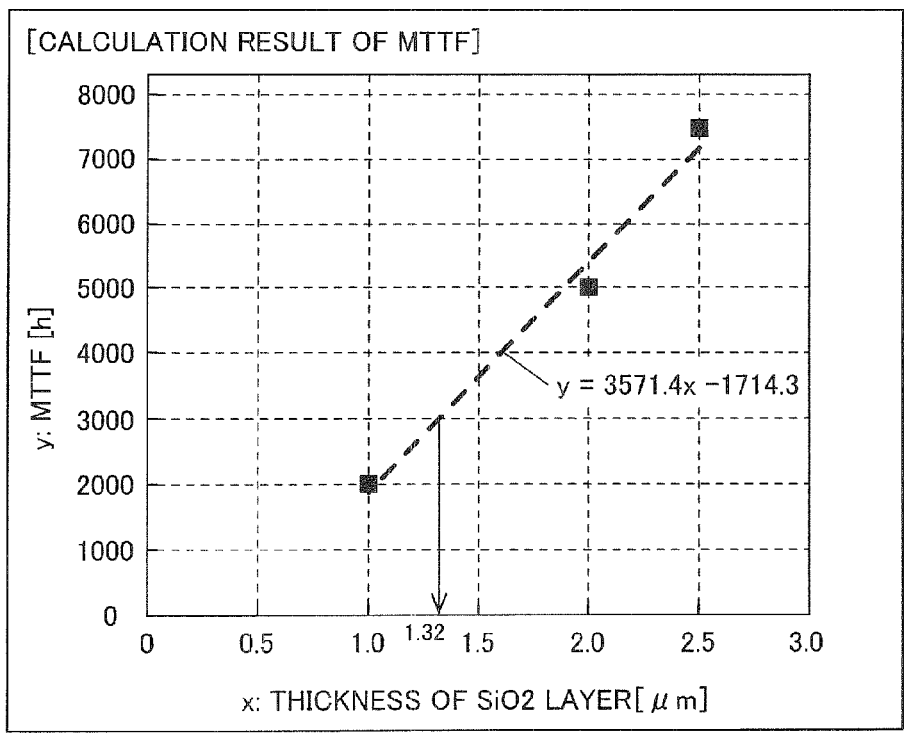
FIG. 4 is a diagram showing results of an experiment for study conducted to investigate the allowable range of the thickness of a dielectric layer in the first embodiment of the present invention.

As a result, MTTF of 5000 hours was obtained in the blue-violet semiconductor laser element including the $SiO_2$ film 35 with a thickness of 2052 nm, MTTF of 7500 hours was obtained in the blue-violet semiconductor laser element including the $SiO_2$ film 35 with a thickness of 2463 nm, and MTTF of 2000 hours was obtained in the blue-violet semiconductor laser element including the $SiO_2$ film 35 with a thickness of 1095 nm, as shown in FIG. 4. Further, when a linear least-squares approximation was performed based on these three actual measured values, the thickness of the $SiO_2$ film 35 meeting at least 3000 hours, which is general MTTF in evaluating a semiconductor laser element, was 1.32 μm. In this case, m was preferably at least 10 in m×λ/(2×n), which is an expression defining the thickness of the $SiO_2$ film 35. Thus, the thickness of the $SiO_2$ film 35 is preferably at least 1.32. In the light of the ease of a film forming process (short film forming time) and the resistance to separation of the film after film formation, it has been concluded that the upper limit of the thickness of the $SiO_2$ film 35 is reasonably about 2463 nm (m=18).

Modification of First Embodiment

Figure 5:
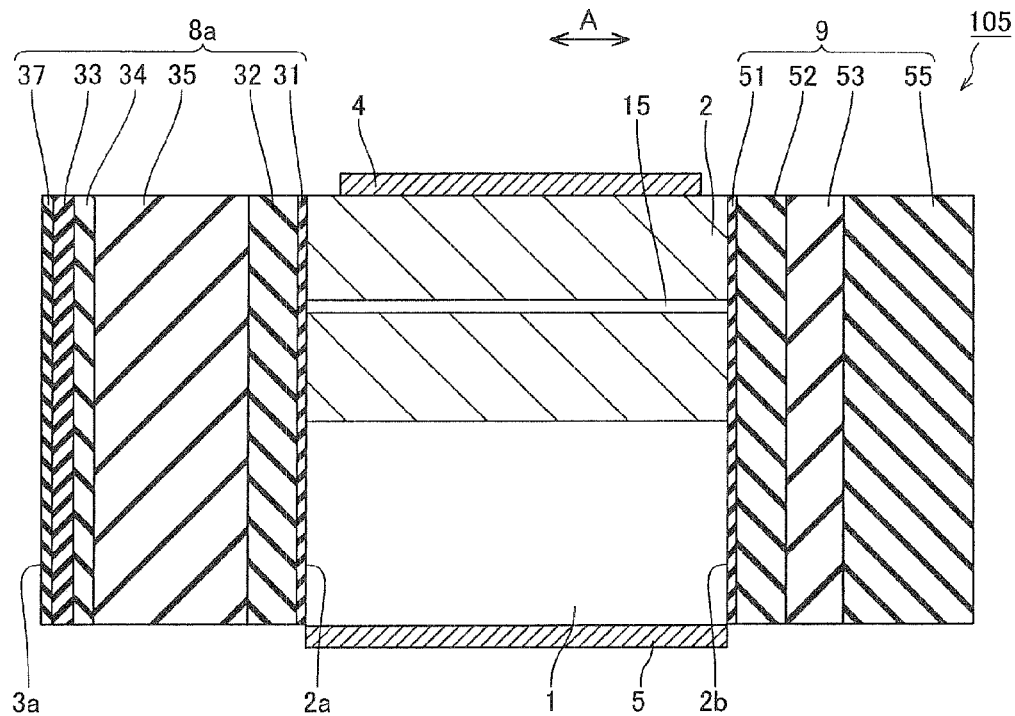
FIG. 5 is a longitudinal sectional view of a blue-violet semiconductor laser element according to a modification of the first embodiment of the present invention in a state cut parallelly to a cavity direction.

A blue-violet semiconductor laser element 105 according to a modification of the first embodiment of the present invention is now described. This blue-violet semiconductor laser element 105 has a facet coating film 8a prepared by successively stacking an AlN film 31, an $Al_2O_3$ film 32, a $SiO_2$ film 35, an Al$_2$O$_3$ film 34, a SiO$_2$ film 33, and a TiO$_2$ film 37 from the side closer to a cavity facet 2a, as shown in FIG. 5. In other words, the facet coating film 8a is formed by successively providing the "dielectric layer" and the "reflectance control layer" in the present invention from the side closer to the cavity facet 2a. In the "reflectance control layer" in the present invention, the Al$_2$O$_3$ film 34 and the SiO$_2$ film 33 are successively stacked from the side closer to the cavity facet 2a. Therefore, the surface of the SiO$_2$ film 33 is an outermost surface 3a of an emitting facet. The blue-violet semiconductor laser element 105 is an example of the "semiconductor laser element" in the present invention. The remaining structure of the blue-violet semiconductor laser element 105 is similar to that of the aforementioned blue-violet semiconductor laser element 100 according to the first embodiment and denoted by the same reference numerals in the figure.

A manufacturing process for the blue-violet semiconductor laser element 105 is similar to the aforementioned manufacturing process for the blue-violet semiconductor laser element 100 according to the first embodiment except a step of stacking the AlN film 31, the Al$_2$O$_3$ film 32, the SiO$_2$ film 35, the Al$_2$O$_3$ film 34, the SiO$_2$ film 33, and the TiO$_2$ film 37 in this order on the cavity facet 2a.

In the blue-violet semiconductor laser element 105, as hereinabove described, two layers of the Al$_2$O$_3$ film 34 and the SiO$_2$ film 33, and the SiO$_2$ film 35 in the facet coating film 8a are stacked in the opposite order to that in the blue-violet semiconductor laser element 100. Even in this case, a laser beam can be easily emitted from the outermost surface 3a in a state where the light density of the laser beam is reduced by the thicker SiO$_2$ film 35, and thereafter the reflectance is adjusted by the two layers of the thinner Al$_2$O$_3$ film 34 and SiO$_2$ film 33. Further, a refractive index difference can be provided between the SiO$_2$ film 35 and the Al$_2$O$_3$ film 34, and hence a laser beam, the light density of which is properly reduced by the SiO$_2$ film 35, can be incident upon the "reflectance control layer" in the present invention without difficulty. Thus, the effects similar to those of the aforementioned first embodiment can be obtained.

Second Embodiment

Figure 6:
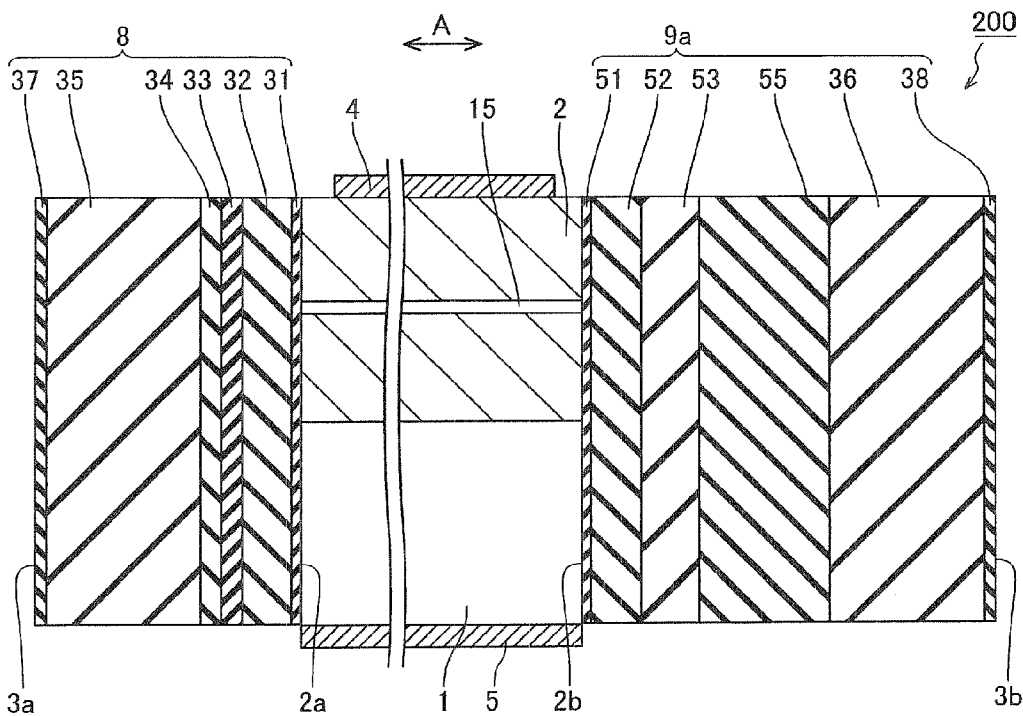
FIG. 6 is a longitudinal sectional view of a blue-violet semiconductor laser element according to a second embodiment of the present invention in a state cut parallelly to a cavity direction.

A blue-violet semiconductor laser element 200 according to a second embodiment of the present invention is now described. In this blue-violet semiconductor laser element 200, a SiO$_2$ film 36 having a thickness of about 2052 nm coming into contact with a multilayer reflecting film 55 and a TiO$_2$ film 38 having a thickness of about 78 nm are provided also in a facet coating film 9a, as shown in FIG. 6. In this case, the surface of the TiO$_2$ film 38 is an outermost surface 3b of a reflecting facet. The blue-violet semiconductor laser element 200 is an example of the "semiconductor laser element" in the present invention. The remaining structure of the blue-violet semiconductor laser element 200 is similar to that of the aforementioned blue-violet semiconductor laser element 100 according to the first embodiment and denoted by the same reference numerals in the figure.

In a manufacturing process for the blue-violet semiconductor laser element 200, the SiO$_2$ film 36 and the TiO$_2$ film 38 are formed in this order on the multilayer reflecting film 55 through steps similar to those in the first embodiment. The remaining steps of the manufacturing process are similar to those of the aforementioned manufacturing process of the first embodiment.

In the blue-violet semiconductor laser element 200, as hereinabove described, the SiO$_2$ film 36 and the TiO$_2$ film 38 are provided also in the outermost surface of the facet coating film 9a, and hence contaminants can be inhibited from adhering to and being deposited on the outermost surface 3b of a reflecting facet. Thus, the intensity of a laser beam emitted from a cavity facet 2b can be stabilized. When the laser beam emitted from the cavity facet 2b is utilized as a monitor for controlling the intensity of a laser beam emitted from a cavity facet 2a, a monitor current obtained by detecting the intensity of the laser beam emitted from the cavity facet 2b can be stabilized. Consequently, the intensity of the laser beam emitted from the cavity facet 2a of the blue-violet semiconductor laser element 200 can be further stabilized. The remaining effects of the second embodiment are similar to those of the aforementioned first embodiment.

Third Embodiment

Figure 7:
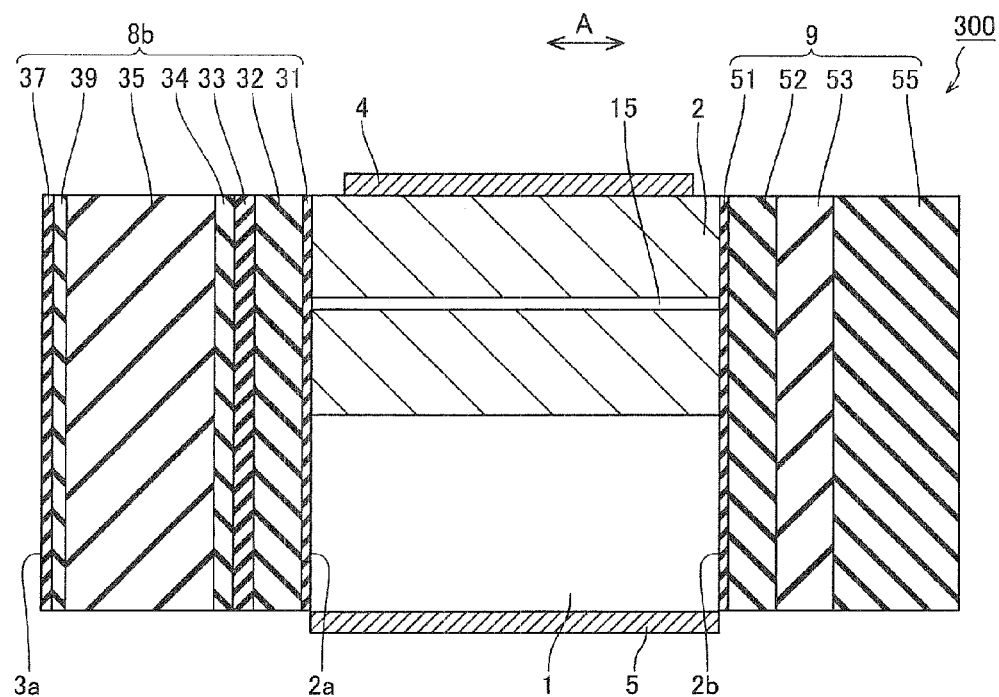
FIG. 7 is a longitudinal sectional view of a blue-violet semiconductor laser element according to a third embodiment of the present invention in a state cut parallelly to a cavity direction.

A blue-violet semiconductor laser element 300 according to a third embodiment of the present invention is now described. In this blue-violet semiconductor laser element 300, an AlN film 39 having a thickness of about 10 nm is provided between a SiO$_2$ film 35 and a TiO$_2$ film 37 in a facet coating film 8b, as shown in FIG. 7. The blue-violet semiconductor laser element 300 is an example of the "semiconductor laser element" in the present invention. The AlN film 39 is an example of the "first nitride film" in the present invention. The remaining structure of the blue-violet semiconductor laser element 300 according to the third embodiment is similar to that of the aforementioned blue-violet semiconductor laser element 100 according to the first embodiment and denoted by the same reference numerals in the figure.

A manufacturing process for the blue-violet semiconductor laser element 300 is similar to the aforementioned manufacturing process for the blue-violet semiconductor laser element 100 according to the first embodiment except a step of forming the AlN film 39 serving as an underlayer of the TiO$_2$ film 37 on the SiO$_2$ film 35 before forming the TiO$_2$ film 37 on an outermost surface 3a of the facet coating film 8b. A film forming process for the AlN film 39 is similar to a film forming process for an AlN film 31. The thickness of the AlN film 39 is preferably not more than 10 nm described above.

In the blue-violet semiconductor laser element 300, as hereinabove described, the AlN film 39 serving as the underlayer is provided between the SiO$_2$ film 35 and the TiO$_2$ film 37, whereby the TiO$_2$ film 37 can be improved in crystallinity by the AlN film 39. Thus, the photocatalytic effect of the TiO$_2$ film 37 can be enhanced. The remaining effects of the third embodiment are similar to those of the aforementioned first embodiment.

Fourth Embodiment

Figure 8:
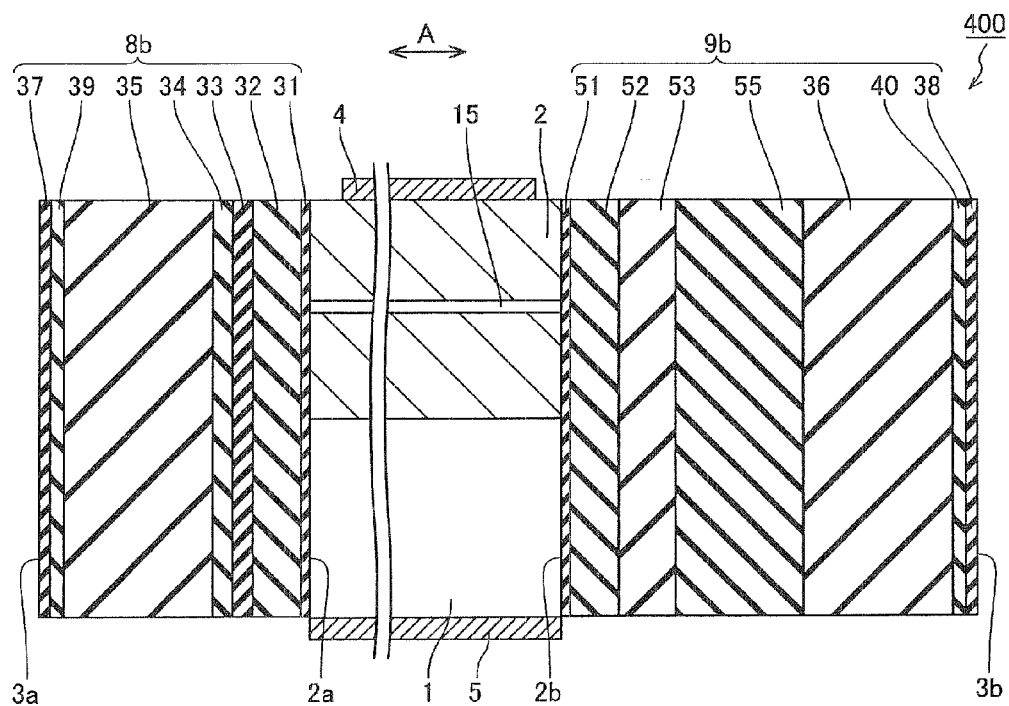
FIG. 8 is a longitudinal sectional view of a blue-violet semiconductor laser element according to a fourth embodiment of the present invention in a state cut parallelly to a cavity direction.

A blue-violet semiconductor laser element 400 according to a fourth embodiment of the present invention is now described. In this blue-violet semiconductor laser element 400, an AlN film 40 having a thickness of about 10 nm is provided between a SiO$_2$ film 36 and a TiO$_2$ film 38 in not only a facet coating film 8b but also a facet coating film 9b, as shown in FIG. 8. The blue-violet semiconductor laser element 400 is an example of the "semiconductor laser element" in the present invention. The remaining structure of the blue-violet semiconductor laser element 400 according to the fourth embodiment is similar to that of the aforementioned blue-violet semiconductor laser element 200 according to the second embodiment and denoted by the same reference numerals in the figure.

A manufacturing process for the blue-violet semiconductor laser element 400 is substantially similar to the aforementioned manufacturing process for the blue-violet semiconductor laser element 300 according to the third embodiment except a step of forming the AlN film 40 serving as an underlayer of the TiO$_2$ film 38 on the SiO$_2$ film 36 before forming the TiO$_2$ film 38 on an outermost surface 3b of the facet coating film 9b.

In the blue-violet semiconductor laser element 400, as hereinabove described, the AlN film 40 is provided between the SiO$_2$ film 36 and the TiO$_2$ film 38, whereby the TiO$_2$ film 38 can be improved in crystallinity by the AlN film 40. Thus, the photocatalytic effects of not only the TiO$_2$ film 37 but also the TiO$_2$ film 38 can be enhanced. The remaining effects of the fourth embodiment are similar to those of the aforementioned second embodiment.

Fifth Embodiment

Figure 9:
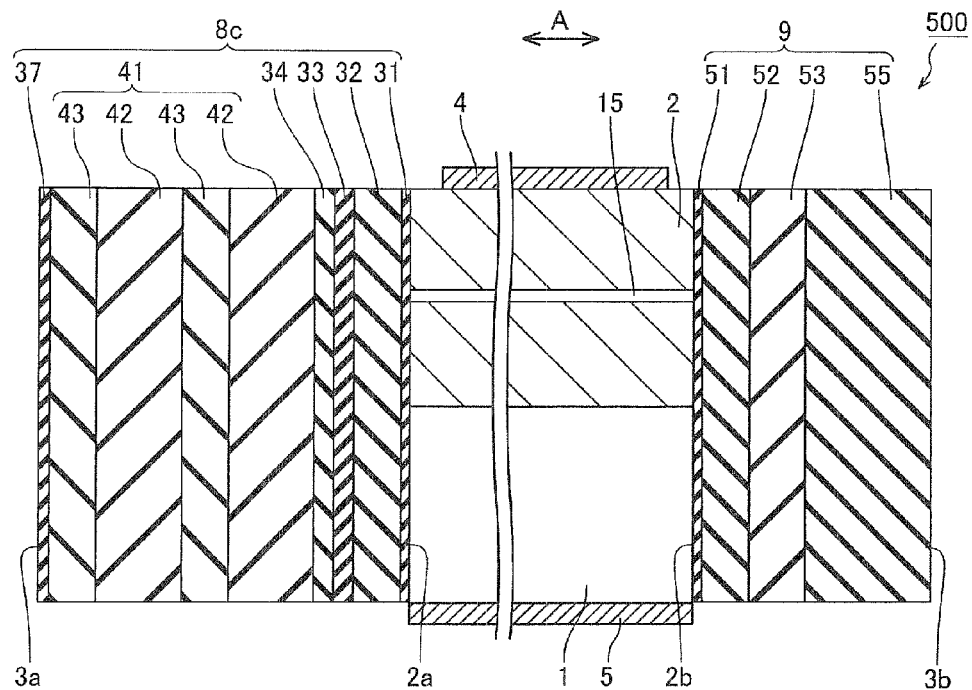
FIG. 9 is a longitudinal sectional view of a blue-violet semiconductor laser element according to a fifth embodiment of the present invention in a state cut parallelly to a cavity direction.

A blue-violet semiconductor laser element 500 according to a fifth embodiment of the present invention is now described. In this blue-violet semiconductor laser element 500, a dielectric layer 41 formed between an Al$_2$O$_3$ film 34 and a TiO$_2$ film 37 is constituted by a plurality of (four) dielectric films, as shown in FIG. 9. The blue-violet semiconductor laser element 500 is an example of the "semiconductor laser element" in the present invention.

Specifically, the dielectric layer 41 has a structure obtained by alternately stacking two SiO$_2$ films 42 each having a thickness of about 410 nm and two AlON films 43 each having a thickness of about 107 nm successively from the side closer to the Al$_2$O$_3$ film 34, and has a total thickness (at least 1 μm) of about 1039 nm. The thickness (about 410 nm) of the SiO$_2$ film 42 is set by applying a relational expression shown by m×λ/(2×n) (m=3). The thickness (about 107 nm) of the AlON film 43 is set by applying a relational expression shown by m×λ/(2×n) (m=1), where the refractive index of AlON is n (=about 1.89). The SiO$_2$ films 42 and the AlON films 43 are examples of the "first dielectric film" and the "second dielectric film" in the present invention, respectively. The remaining structure of the blue-violet semiconductor laser element 500 according to the fifth embodiment is similar to that of the aforementioned blue-violet semiconductor laser element 100 according to the first embodiment and denoted by the same reference numerals in the figure.

A manufacturing process for the blue-violet semiconductor laser element 500 is similar to the aforementioned manufacturing process of the first embodiment except that the dielectric layer 41 is formed in place of the SiO$_2$ film 35.

In the blue-violet semiconductor laser element 500, as hereinabove described, the dielectric layer 41 has a multilayer film structure obtained by alternately stacking the two SiO$_2$ films 42 and the two AlON films 43, and each layer is set to a thickness defined by m×λ/(2×n). Thus, the dielectric layer 41 is constituted by the SiO$_2$ films 42 and the AlON films 43 each having a thickness not influencing the reflectance, and hence a SiO$_2$ film 33 and the Al$_2$O$_3$ film 34 can easily control the reflectance of a cavity facet 2a without any influence of the dielectric layer 41. Further, the dielectric layer 41 can be formed by repeatedly alternately arranging an oxynitride film (AlON film 43) with a relatively larger film stress and an oxide film (SiO$_2$ film 42) with a relatively smaller film stress, and hence the thick dielectric layer 41 can be easily formed while an excessive increase in the film stress is inhibited. The total thickness of the dielectric layer 41 is more preferably at least 1.32 μm.

In the blue-violet semiconductor laser element 500, the thickness of the SiO$_2$ film 42 is larger than the thickness of the AlON film 43 in the dielectric layer 41. Thus, the thickness of the AlON film 43 of an oxynitride film with a relatively larger film stress is rendered smaller than the thickness of the SiO$_2$ film 42 of an oxide film with a relatively smaller film stress to form the dielectric layer 41, and hence an excessive increase in the film stress of the thick dielectric layer 41 can be inhibited. The remaining effects of the fifth embodiment are similar to those of the aforementioned first embodiment.

Sixth Embodiment

Figure 10:
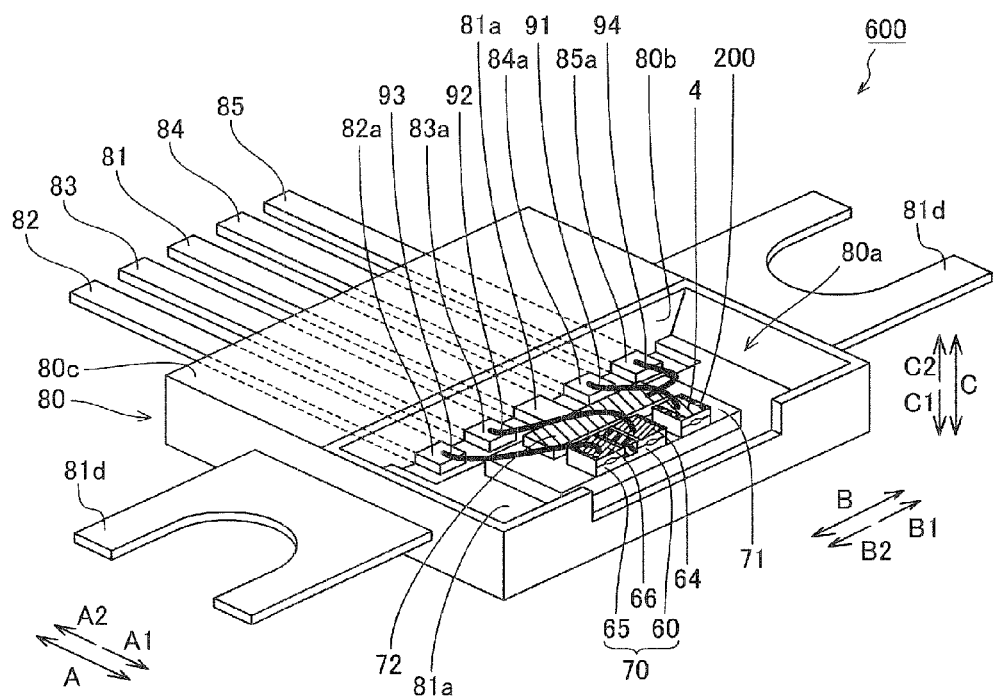
FIG. 10 is a perspective view showing the structure of a semiconductor laser device mounted with a three-wavelength semiconductor laser element according to a sixth embodiment of the present invention.

The structure of a three-wavelength semiconductor laser device 600 according to a sixth embodiment of the present invention is now described with reference to FIG. 10. The three-wavelength semiconductor laser device 600 is an example of the "semiconductor laser device" in the present invention.

In the three-wavelength semiconductor laser device 600 according to the sixth embodiment of the present invention, the aforementioned blue-violet semiconductor laser element 200 according to the second embodiment and a two-wavelength semiconductor laser element 70 having a red semiconductor laser element 60 with a lasing wavelength of about 650 nm and an infrared semiconductor laser element 65 with a lasing wavelength of about 780 nm monolithically formed are bonded onto the bottom surface of a protruding block 80a of a substantially tabular base body 80 made of an insulator (resin) through a submount 71. The three-wavelength semiconductor laser device 600 is an open package type semiconductor laser device in which the blue-violet semiconductor laser element 200 and the two-wavelength semiconductor laser element 70 are exposed on the protruding block 80a. The base body 80 is an example of the "open-to-atmosphere-type package" in the present invention.

The blue-violet semiconductor laser element 200 and the two-wavelength semiconductor laser element 70 are mounted in a junction-up system such that respective laser beam-emitting facets face outward (in a direction A1) and are adjacent to each other at a prescribed interval in the width direction (direction B).

The base body 80 is provided with lead terminals 81, 82, 83, 84, and 85 each made of a metal lead frame. These lead terminals 81 to 85 are arranged to pass through the base body 80 from the front side (A1 side) to the rear side (A2 side) in a state insulated from each other by resin mold. Rear end regions extending to the outside (A2 side) of the base body 80 each are connected to a driving circuit (not shown). Front end regions 81a, 82a, 83a, 84a, and 85a of the lead terminals 81 to 85 extending to the front side (A1 side) are exposed from an inner wall surface 80b of the base body 80 constituting the protruding block 80a and arranged on the bottom surface of the protruding block 80a. The bottom surface of the protruding block 80a is formed to have a prescribed depth downward (in a direction C1) from the upper surface 80c (C2 side) of the base body 80. The front end region 81a widens in the direction B on the bottom surface of the protruding block 80a on the front side (A1 side) of the front end regions 82a to 85a.

The lead terminal 81 is integrally formed with a pair of heat radiation portions 81d connected to the front end region 81a. The heat radiation portions 81d are arranged substantially symmetrically about the lead terminal 81 on both sides in the direction B. The heat radiation portions 81d extend from the front end region 81a and pass through the base body 80 in directions B1 and B2 from the side surfaces to be exposed.

A first end of a metal wire 91 is bonded to a p-side electrode 4, and a second end of the metal wire 91 is connected to the front end region 84a of the lead terminal 84. A first end of a metal wire 92 is bonded to a surface electrode 64 formed on the upper surface of the red semiconductor laser element 60, and a second end of the metal wire 92 is connected to the front end region 83a of the lead terminal 83. A first end of a metal wire 93 is bonded to a surface electrode 66 formed on the upper surface of the infrared semiconductor laser element 65, and a second end of the metal wire 93 is connected to the front end region 82a of the lead terminal 82. An n-side electrode (not shown) formed on the lower surface of the blue-violet semiconductor laser element 200 and an n-side electrode (not shown) formed on the lower surface of the two-wavelength semiconductor laser element 70 are electrically connected to the front end region 81a of the lead terminal 81 through the submount 71.

A photodiode (PD) 72 employed to monitor the intensity of laser beams is arranged on a rear portion (on the A2 side) of the submount 71 closer to the cavity facet 2b of the blue-violet semiconductor laser element 200 such that a photosensitive surface thereof faces upward (in a direction C2). The lower surface of the PD 72 is electrically connected to the submount 71. A first end of a metal wire 94 made of Au or the like is bonded onto the upper surface of the PD 72, and a second end of the metal wire 94 is connected to the front end region 85a of the lead terminal 85.

The three-wavelength semiconductor laser device 600 includes the aforementioned blue-violet semiconductor laser element 200. Thus, the reliable three-wavelength semiconductor laser device 600 capable of stably operating the blue-violet semiconductor laser element 200 and enduring the use for a long time can be obtained. Further, the three-wavelength semiconductor laser device 600 includes the open-to-atmosphere-type package not requiring hermetic sealing, and hence the structure of the three-wavelength semiconductor laser device 600 can be simplified.

Seventh Embodiment

Figure 11:
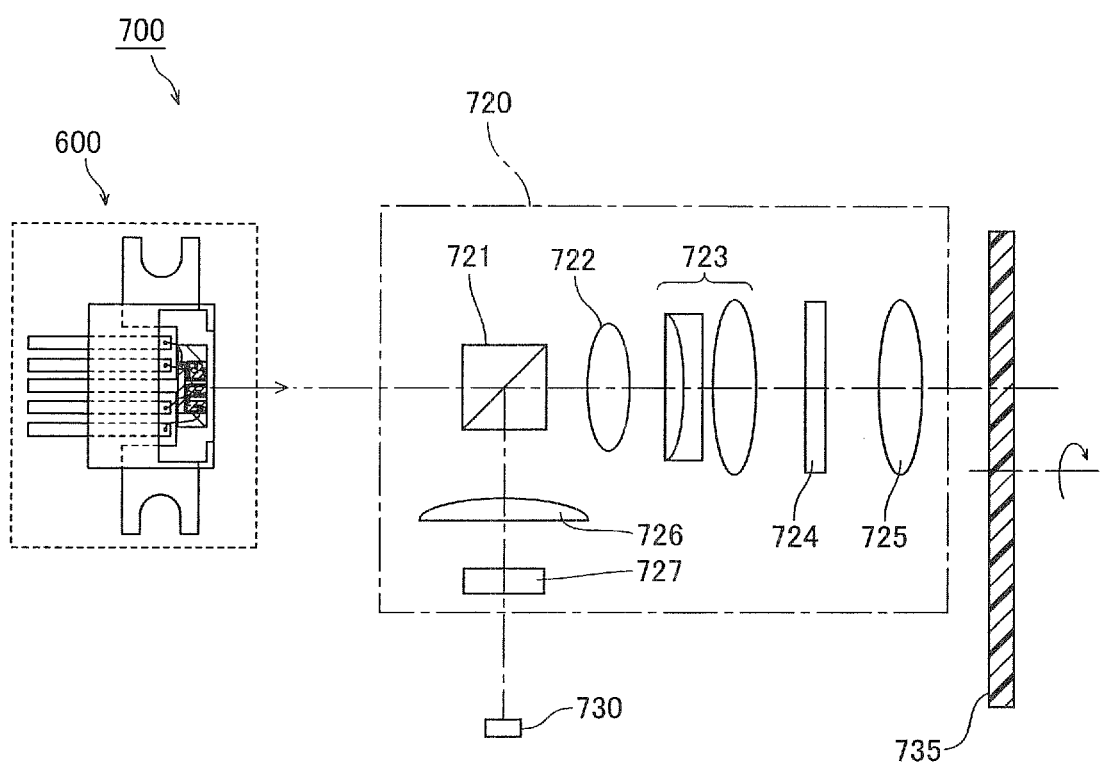
FIG. 11 is a schematic diagram showing the structure of an optical pickup mounted with a semiconductor laser device according to a seventh embodiment of the present invention.

The structure of an optical pickup 700 according to a seventh embodiment of the present invention is now described with reference to FIG. 11. The optical pickup 700 is an example of the "optical apparatus" in the present invention.

The optical pickup 700 according to the seventh embodiment of the present invention stores the aforementioned three-wavelength semiconductor laser device 600 according to the sixth embodiment. The optical pickup 700 includes the three-wavelength semiconductor laser device 600, an optical system 720 adjusting laser beams emitted from the three-wavelength semiconductor laser device 600, and a light detection portion 730 receiving the laser beams.

The optical system 720 has a polarizing beam splitter (PBS) 721, a collimator lens 722, a beam expander 723, a $\lambda/4$ plate 724, an objective lens 725, a cylindrical lens 726, and an optical axis correction device 727.

The PBS 721 totally transmits the laser beams emitted from the three-wavelength semiconductor laser device 600, and totally reflects the laser beams fed back from an optical disc 735. The collimator lens 722 converts the laser beams emitted from the three-wavelength semiconductor laser device 600 and transmitted through the PBS 721 to parallel beams. The beam expander 723 is constituted by a concave lens, a convex lens, and an actuator (not shown). The actuator has a function of correcting wave surface states of the laser beams emitted from the three-wavelength semiconductor laser device 600 by varying a distance between the concave lens and the convex lens in response to a servo signal from a servo circuit described later.

The $\lambda/4$ plate 724 converts the linearly polarized laser beams, substantially converted to the parallel beams by the collimator lens 722, to circularly polarized beams. Further, the $\lambda/4$ plate 724 converts the circularly polarized laser beams fed back from the optical disc 735 to linearly polarized beams. A direction of linear polarization in this case is orthogonal to a direction of linear polarization of the laser beams emitted from the three-wavelength semiconductor laser device 600. Thus, the PBS 721 substantially totally reflects the laser beams fed back from the optical disc 735. The objective lens 725 converges the laser beams transmitted through the $\lambda/4$ plate 724 on a surface (recording layer) of the optical disc 735. An objective lens actuator (not shown) renders the objective lens 725 movable in a focus direction, a tracking direction and a tilt direction in response to servo signals (a tracking servo signal, a focus servo signal, and a tilt servo signal) from the servo circuit described later.

The cylindrical lens 726, the optical axis correction device 727, and the light detection portion 730 are arranged to be along optical axes of the laser beams totally reflected by the PBS 721. The cylindrical lens 726 provides the incident laser beams with astigmatic action. The optical axis correction device 727 is constituted by a diffraction grating and so arranged that spots of zero-order diffracted beams of blue-violet, red, and infrared laser beams transmitted through the cylindrical lens 726 coincide with each other on a detection region of the light detection portion 730 described later.

The light detection portion 730 outputs a playback signal on the basis of intensity distribution of the received laser beams. The light detection portion 730 has a detection region of a prescribed pattern, to obtain a focus error signal, a tracking error signal, and a tilt error signal along with the playback signal. Thus, the optical pickup 700 including the three-wavelength semiconductor laser device 600 is formed.

In this optical pickup 700, the three-wavelength semiconductor laser device 600 can independently emit blue-violet, red, and infrared laser beams from the blue-violet semiconductor laser element 200, the red semiconductor laser element 60, and the infrared semiconductor laser element 65 by independently applying voltages between the lead terminal 81 and the lead terminals 82 to 84, respectively. The laser beams emitted from the three-wavelength semiconductor laser device 600 are adjusted by the PBS 721, the collimator lens 722, the beam expander 723, the $\lambda/4$ plate 724, the objective lens 725, the cylindrical lens 726, and the optical axis correction device 727 as described above, and thereafter applied onto the detection region of the light detection portion 730.

When data recorded in the optical disc 735 is play backed, the laser beams emitted from the blue-violet semiconductor laser element 200, the red semiconductor laser element 60, and the infrared semiconductor laser element 65 are controlled to have constant power and applied to the recording layer of the optical disc 735, so that the playback signal output from the light detection portion 730 can be obtained. The actuator of the beam expander 723 and the objective lens actuator driving the objective lens 725 can be feedback-controlled by the focus error signal, the tracking error signal, and the tilt error signal simultaneously output.

When data is recorded in the optical disc 735, the laser beams emitted from the blue-violet semiconductor laser element 200 and the red semiconductor laser element 60 (infrared semiconductor laser element 65) are controlled in power and applied to the optical disc 735, on the basis of the data to be recorded. Thus, the data can be recorded in the recording layer of the optical disc 735. Similarly to the above, the actuator of the beam expander 723 and the objective lens actuator driving the objective lens 725 can be feedback-controlled by the focus error signal, the tracking error signal, and the tilt error signal output from the light detection portion 730.

Thus, the data can be recorded in or played back from the optical disc 735 with the optical pickup 700 including the three-wavelength semiconductor laser device 600.

The optical pickup 700 is mounted with the aforementioned three-wavelength semiconductor laser device 600. Thus, the optical pickup 700 mounted with the reliable three-wavelength semiconductor laser device 600 capable of enduring the use for a long time can be easily obtained.

Although the present invention has been described and illustrated in detail, it is clearly understood that the same is by way of illustration and example only and is not to be taken by way of limitation, the spirit and scope of the present invention being limited only by the terms of the appended claims.

For example, while the "reflectance control layer" in the present invention is formed by stacking the $SiO_2$ film 33 and the $Al_2O_3$ film 34, which both are oxide films, in each of the aforementioned first to seventh embodiments, the present invention is not restricted to this, but the "reflectance control layer" in the present invention may be formed employing a nitride film, an oxide film, and an oxynitride film. In this case, a nitride film containing an Al element or a Si element can be employed as the nitride film. An oxide film and an oxynitride film containing an Al element, a Si element, a Zr element, a Ta element, a Hf element, a Nb element, a Ti element, or the like can be employed as the oxide film and the oxynitride film. Thus, the reflectance of the reflectance control layer can be properly controlled to be at least about 20% by forming a multilayer film of a low refractive index layer and a high refractive index layer. Further, the facet coating film 9 on the side of the cavity facet 2b may be formed of an inorganic dielectric layer of the material shown in the aforementioned modification in addition to the material shown in each of the aforementioned first to seventh embodiments. Thus, the reflectance of the facet coating film 9 can be properly controlled to be at least about 50%.

While the "reflectance control layer" in the present invention has a multi-layer film structure obtained by stacking the $SiO_2$ film 33 and the $Al_2O_3$ film 34 in each of the aforementioned first to seventh embodiments, in the present invention, the "reflectance control layer" in the present invention may be formed of a single layer film.

While the "dielectric layer" in the present invention is formed of a single layer film of the $SiO_2$ film 35 (refractive index: about 1.48) in each of the aforementioned first to fourth, sixth and seventh embodiments, the present invention is not restricted to this, but the "dielectric layer" in the present invention may be formed of a single layer film of an oxide film containing an Al element, a Zr element, a Ta element, a Hf element, a Nb element, a Ti element, or the like.

If the "dielectric layer" in the present invention is formed of an $Al_2O_3$ film (refractive index: about 1.68), for example, m is preferably at least 11 and not more than 21 in the relational expression shown by $m \times \lambda/(2 \times n)$ as to the thickness of the $Al_2O_3$ film. Alternatively, if the "dielectric layer" in the present invention is formed of a $Ta_2O_5$ film (refractive index: about 2.1), m is preferably at least 14 and not more than 26 in the relational expression shown by $m \times \lambda/(2 \times n)$ as to the thickness of the $Ta_2O_5$ film. Alternatively, if the "dielectric layer" in the present invention is formed of a $ZrO_2$ film (refractive index: about 2.2), m is preferably at least 15 and not more than 28 in the relational expression shown by $m \times \lambda/(2 \times n)$ as to the thickness of the $ZrO_2$ film. Each dielectric layer is preferably formed such that the refractive index n2 of the "dielectric layer" is smaller than the refractive index n1 of the "reflectance control layer" in the present invention.

While the dielectric layer 41 having a multi-layer film structure is provided in the facet coating film 8b in the aforementioned fifth embodiment, the present invention is not restricted to this. In the present invention, the dielectric layer 41 may be formed also in the facet coating film 9 on the side of the reflecting facet. Alternatively, this dielectric layer 41 having a multi-layer film structure may be formed in place of the $SiO_2$ film 36 in each of the aforementioned second and fourth embodiments.

While the dielectric layer 41 is formed by alternately stacking the two $SiO_2$ films 42 and the two AlON films 43 successively from the side closer to the $Al_2O_3$ film 34 in the aforementioned fifth embodiment, the present invention is not restricted to this. In the present invention, the three or more $SiO_2$ films 42 and the three or more AlON films 43 may be alternately stacked. Alternatively, the $SiO_2$ films 42 and the AlON films 43 may be alternately stacked in the opposite order to that described above. As to the thickness of the oxynitride film (the AlON film 43 or the like) constituting the dielectric layer 41, m is preferably equal to 1 in the relational expression shown by $m \times \lambda/(2 \times n)$.

While the "photocatalytic layer" in the present invention is formed of a single layer film of the $TiO_2$ film 37 in each of the aforementioned first to seventh embodiments, the present invention is not restricted to this, but the "photocatalytic layer" in the present invention may be formed of a single layer film of an oxynitride film. Alternatively, the oxide film may be an oxide film containing a W element such as $WO_3$ in addition to the $TiO_2$ film 37. Alternatively, an oxynitride film containing a Ti element or a W element can be employed as the oxynitride film.

While the "photocatalytic layer" in the present invention is formed of a photocatalyst material of $TiO_2$ in each of the aforementioned first to seventh embodiments, the present invention is not restricted to this. In the present invention, the "photocatalytic layer" in the present invention may be formed of a photocatalyst material of $TiO_2$ doped with N, $TiO_2$ doped with C, $TiO_2$ doped with S, or the like other than $TiO_2$.

While the multilayer reflecting film 55 controlling the reflectance of the cavity facet 2b is formed by alternately stacking the three $SiO_2$ films and the three $ZrO_2$ films in each of the aforementioned first to seventh embodiments, the present invention is not restricted to this. In the present invention, the $SiO_2$ films and the $ZrO_2$ films may be alternately stacked in numbers other than three. Further, different two types of insulating films having other refractive indices other than the $SiO_2$ films and the $ZrO_2$ films may be combined as the multilayer reflecting film.

While the optical pickup 700 including the "semiconductor laser device" in the present invention has been shown in the aforementioned seventh embodiment, the present invention is not restricted to this, but the semiconductor laser device in the present invention may be applied to an optical disc apparatus performing record in an optical disc such as a CD, a DVD, or a BD and playback of the optical disc and an optical apparatus such as a projector.

While the "facet coating film" in the present invention is formed with the ECR sputtering film deposition apparatus in each of the manufacturing processes of the aforementioned first to seventh embodiments, the present invention is not restricted to this, but the facet coating film may be formed by another film deposition method.

What is claimed is:

1. A semiconductor laser element comprising:
   a semiconductor element layer including an active layer and having an emitting side cavity facet and a reflecting side cavity facet; and
   a facet coating film on a surface of said emitting side cavity facet, wherein
   said facet coating film includes a photocatalytic layer arranged on an outermost surface of said facet coating film and a dielectric layer arranged between said photocatalytic layer and said emitting side cavity facet, and
   a thickness of said dielectric layer is at least 1 µm,
   said facet coating film further includes an oxidation preventing layer preventing oxidation of said emitting side cavity facet, and
   said oxidation preventing layer has a nitride film coming into contact with said emitting side cavity facet.

2. The semiconductor laser element according to claim 1, wherein
   a thickness of said photocatalytic layer is smaller than said thickness of said dielectric layer.

3. The semiconductor laser element according to claim 2, wherein
   said photocatalytic layer is set to a thickness defined by $m \times \lambda/(2 \times n)$ (m is an integer).

4. The semiconductor laser element according to claim 2, wherein
   a refractive index of said photocatalytic layer is larger than a refractive index of said dielectric layer.

5. The semiconductor laser element according to claim 1, wherein
   said photocatalytic layer and said dielectric layer are in contact with each other.

6. The semiconductor laser element according to claim 1, wherein
   said photocatalytic layer is formed on said dielectric layer through a nitride film.

7. The semiconductor laser element according to claim 1, wherein
   said dielectric layer is made of a $SiO_2$ film.

8. The semiconductor laser element according to claim 1, wherein
   said dielectric layer has a multi-layer film structure made of a plurality of dielectric films.

9. The semiconductor laser element according to claim 8, wherein
   said dielectric layer has said multi-layer film structure obtained by stacking a first dielectric film of $SiO_2$ and a second dielectric film of AlON, and
   a thickness of said first dielectric film is larger than a thickness of said second dielectric film.

10. The semiconductor laser element according to claim 9, wherein
    at least two said first dielectric films and at least two said second dielectric films are alternately stacked in said dielectric layer.

11. The semiconductor laser element according to claim 1, wherein
    said facet coating film further includes a reflectance control layer controlling a reflectance of said emitting side cavity facet.

12. The semiconductor laser element according to claim 11, wherein
    a high refractive index layer having a refractive index larger than a refractive index of said dielectric layer and a low refractive index layer having a refractive index smaller than said refractive index of said high refractive index layer are stacked in said reflectance control layer, and
    said dielectric layer and said reflectance control layer are arranged through said high refractive index layer of said reflectance control layer.

13. The semiconductor laser element according to claim 1, wherein
    said oxidation preventing layer is a dielectric film made of a plurality of layers.

14. The semiconductor laser element according to claim 1, wherein
    said semiconductor element layer is made of a nitride-based semiconductor.

15. A semiconductor laser device comprising:
    a semiconductor laser element including a semiconductor element layer including an active layer and having an emitting side cavity facet and a reflecting side cavity facet, and a facet coating film on a surface of said emitting side cavity facet; and
    an open-to-atmosphere-type package mounting with said semiconductor laser element, wherein
    said facet coating film includes a photocatalytic layer arranged on an outermost surface of said facet coating film and a dielectric layer arranged between said photocatalytic layer and said emitting side cavity facet, and
    a thickness of said dielectric layer is at least 1 µm,
    said facet coating film further includes an oxidation preventing layer preventing oxidation of said emitting side cavity facet, and
    said oxidation preventing layer has a nitride film coming into contact with said emitting side cavity facet.

16. An optical apparatus comprising:
    a semiconductor laser device including a semiconductor laser element having a semiconductor element layer including an active layer and having an emitting side cavity facet and a reflecting side cavity facet, and a facet coating film on a surface of said emitting side cavity facet, and an open-to-atmosphere-type package mounting with said semiconductor laser element; and
    an optical system controlling a beam emitted from said semiconductor laser element, wherein
    said facet coating film includes a photocatalytic layer arranged on an outermost surface of said facet coating film and a dielectric layer arranged between said photocatalytic layer and said emitting side cavity facet, and
    a thickness of said dielectric layer is at least 1 µm,
    said facet coating film further includes an oxidation preventing layer preventing oxidation of said emitting side cavity facet, and
    said oxidation preventing layer has a nitride film coming into contact with said emitting side cavity facet.

17. The semiconductor laser element according to claim 11, wherein
    said reflectance control layer is made of a plurality of dielectric films, at least one film of said dielectric films has a thickness of $\lambda/(4 \times n)$ or approximately $\lambda/(4 \times n)$, where a wavelength of a laser beam emitted from said active layer is $\lambda$ and a refractive index of said one film of said dielectric films is n.

18. The semiconductor laser element according to claim 1, wherein
    said dielectric layer has a dielectric film having a thickness of at least 1 µm.

19. The semiconductor laser element according to claim 1, wherein
    said photocatalytic layer is made of a $TiO_2$ film.

20. The semiconductor laser element according to claim 19, wherein
a portion of said photocatalytic layer corresponding to said active layer has a crystalline substance of $TiO_2$.

* * * * *